(12) United States Patent
Menard et al.

(10) Patent No.: US 9,658,682 B2
(45) Date of Patent: May 23, 2017

(54) REFERENCE VOLTAGE CIRCUITS IN MICROCONTROLLER SYSTEMS

(75) Inventors: Patrice Menard, Saint-Mars-du-Desert (FR); Olivier Husson, Nantes (FR); Mickael Le Dily, Carquefou (FR); Thierry Gourbilleau, Le Loroux-Bottereau (FR); Marc Laurent, Nantes (FR); Stefan Schabel, Syrgenstein (DE); Ronan Barzic, Tiller (NO)

(73) Assignee: Atmel Corporation, San Jose, CA (US)

( * ) Notice: Subject to any disclaimer, the term of this patent is extended or adjusted under 35 U.S.C. 154(b) by 304 days.

(21) Appl. No.: 13/603,155

(22) Filed: Sep. 4, 2012

(65) Prior Publication Data

US 2014/0028384 A1 Jan. 30, 2014

Related U.S. Application Data

(60) Provisional application No. 61/676,595, filed on Jul. 27, 2012.

(51) Int. Cl.
| | | |
|---|---|---|
| *G06F 1/00* | (2006.01) | |
| *G06F 1/32* | (2006.01) | |
| *G11C 5/14* | (2006.01) | |
| *G11C 16/30* | (2006.01) | |

(52) U.S. Cl.
CPC .......... *G06F 1/3296* (2013.01); *G06F 1/3243* (2013.01); *G11C 5/147* (2013.01); *G11C 16/30* (2013.01); *Y02B 60/1239* (2013.01); *Y02B 60/1285* (2013.01); *Y02B 60/32* (2013.01)

(58) Field of Classification Search
CPC ............... G06F 1/32; G06F 1/26; G06F 1/266

USPC .......................................................... 713/300
See application file for complete search history.

(56) References Cited

U.S. PATENT DOCUMENTS

| | | | |
|---|---|---|---|
| 6,177,788 B1* | 1/2001 | Narendra et al. ............. 323/315 |
| 6,424,128 B1 | 7/2002 | Hiraki et al. |
| 6,507,523 B2 | 1/2003 | Pekny |
| 6,798,275 B1* | 9/2004 | Le et al. ....................... 327/536 |
| 7,049,797 B2 | 5/2006 | Fukui et al. |
| 7,750,584 B1* | 7/2010 | Li ............................. G06F 1/26 |
| | | | 318/106 |
| 7,995,047 B2 | 8/2011 | Mizuki et al. |
| 2003/0151957 A1* | 8/2003 | Pekny ...................... 365/189.11 |
| 2004/0042319 A1 | 3/2004 | Lee |
| 2006/0255781 A1 | 11/2006 | Itoh |

(Continued)

OTHER PUBLICATIONS

U.S. Appl. No. 13/587,525, filed Aug. 16, 2012, NFOA dated Jul. 16, 2014, 18 pages.

(Continued)

*Primary Examiner* — Phil Nguyen
*Assistant Examiner* — Austin Hicks
(74) *Attorney, Agent, or Firm* — Fish & Richardson P.C.

(57) ABSTRACT

A microcontroller system includes a higher power reference voltage circuit and a lower power reference voltage circuit configured to draw less power than the higher power reference voltage circuit when enabled. The system includes a power state logic controller configured to enable the lower power reference voltage circuit to provide a first regulated voltage during a power saving mode, and, on exiting the power saving mode, enable the higher power reference voltage circuit to provide a second regulated voltage.

9 Claims, 5 Drawing Sheets

(56) References Cited

U.S. PATENT DOCUMENTS

| | | | |
|---|---|---|---|
| 2007/0079147 A1* | 4/2007 | Pyeon et al. | 713/300 |
| 2008/0024204 A1 | 1/2008 | Choy et al. | |
| 2008/0136381 A1* | 6/2008 | Yang et al. | 323/220 |
| 2008/0198657 A1* | 8/2008 | Kim | G11C 5/14 |
| | | | 365/185.18 |
| 2008/0284402 A1 | 11/2008 | Ishino | |
| 2009/0044034 A1 | 2/2009 | Wong et al. | |
| 2009/0256547 A1* | 10/2009 | Akyildiz | H02J 9/005 |
| | | | 323/350 |
| 2011/0055594 A1* | 3/2011 | Wu | 713/300 |
| 2012/0194151 A1 | 8/2012 | Gunther | |
| 2015/0009772 A1 | 1/2015 | Chen et al. | |

OTHER PUBLICATIONS

U.S. Appl. No. 13/587,525, filed Aug. 16, 2012, FOA dated Jan. 9, 2015, 14 pages.

U.S. Appl. No. 13/587,525, filed Aug. 16, 2012, NFOA dated May 13, 2015, 21 pages.

U.S. Appl. No. 13/798,991, filed Mar. 13, 2013, NFOA dated May 15, 2015, 12 pages.

* cited by examiner

REFERENCE VOLTAGE CIRCUITS IN MICROCONTROLLER SYSTEMS

CROSS-REFERENCE TO RELATED APPLICATIONS

This application claims the benefit and priority of U.S. Provisional Application Ser. No. 61/676,595, filed Jul. 27, 2012, the entire contents of which are hereby incorporated by reference.

TECHNICAL FIELD

This disclosure relates generally to electronics and more particularly to reference voltage circuits.

BACKGROUND

A reference voltage circuit is a circuit that produces a fixed voltage to a device. The fixed voltage is substantially constant despite variations in temperature. In systems on a chip, the current drawn by reference voltage circuit can become a significant contributor to the total power drawn by the chip in a power saving mode. Even though the core logic may not be operating in a power saving mode, the reference voltage circuit continues to draw current, and may be needed by certain components that continue operating in a power saving mode.

SUMMARY

In some implementations, a microcontroller system includes a higher power reference voltage circuit and a lower power reference voltage circuit configured to draw less power than the higher power reference voltage circuit when enabled. The system includes a power state logic controller configured to enable the lower power reference voltage circuit to provide a first regulated voltage during a power saving mode, and, on exiting the power saving mode, enable the higher power reference voltage circuit to provide a second regulated voltage. In some implementations, a microcontroller system includes a main reference voltage circuit and a secondary reference voltage circuit having a faster startup time than the main reference voltage circuit. The system includes a power state logic controller configured to enable the main reference voltage circuit and the secondary reference voltage circuit on exiting a power saving mode, select the secondary reference voltage circuit while the main reference voltage circuit is starting up, and select the main reference voltage circuit when the main reference voltage circuit is ready.

Particular implementations can provide one or more of the following advantages: 1) the system can use less power in power saving mode by switching to a lower power reference voltage circuit; 2) the system, by selecting between different reference voltage circuits, can select a reference voltage circuit that uses less power and has lower accuracy when higher accuracy components are not in use; 3) the system startup time on exiting a power saving mode can be reduced compared to some conventional systems; and 4) some modules can be ready to function sooner after exiting a power saving mode.

The details of one or more disclosed implementations are set forth in the accompanying drawings and the description below. Other features, aspects, and advantages will become apparent from the description, the drawings and the claims.

DETAILED DESCRIPTION

Example Microcontroller System

Figure 1:
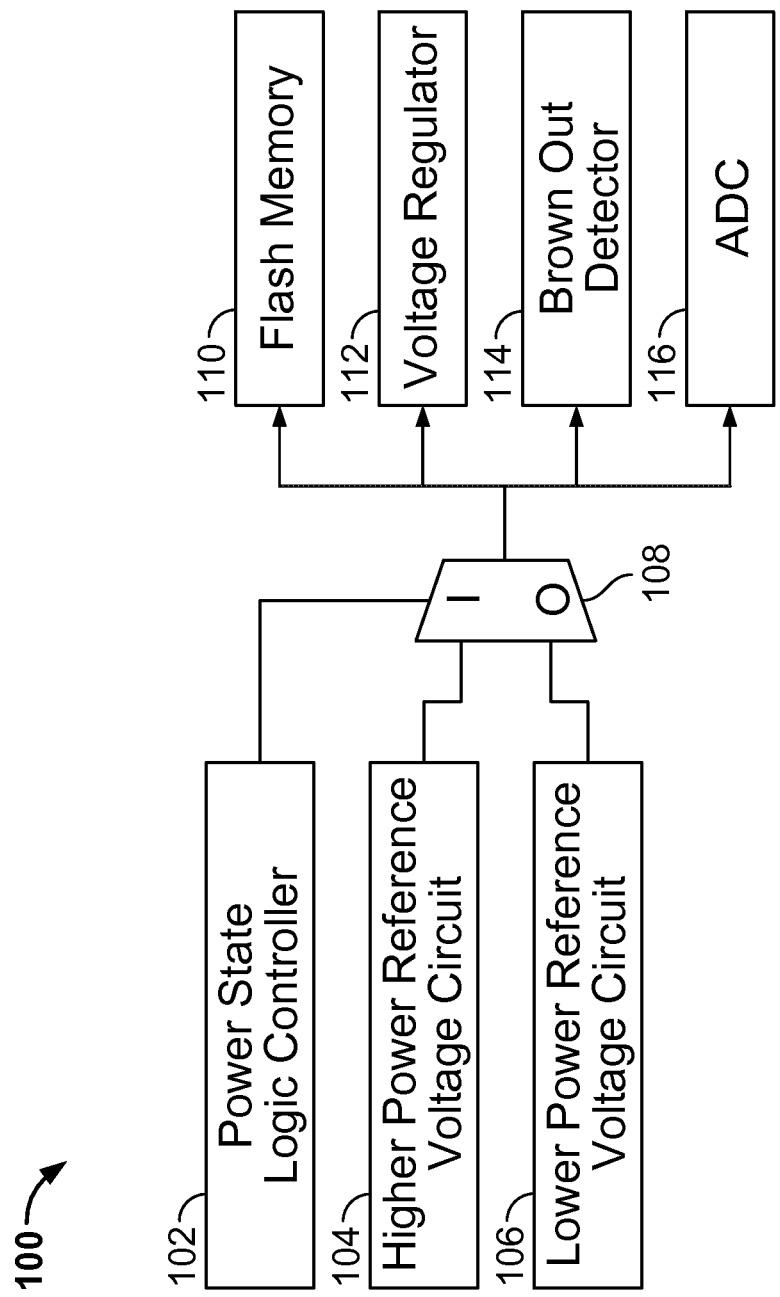
FIG. 1 is a block diagram of an example microcontroller system.

FIG. 1 is a block diagram of an example microcontroller system 100. The system includes a power state logic controller 102, a higher power reference voltage circuit 104, and a lower power reference voltage circuit 106. The reference voltage circuits are coupled to a number of modules by a selection circuit 108. The power state logic controller configures the selection circuit to couple either the higher power reference voltage circuit or the lower power reference voltage circuit or both to the modules. The modules include a flash memory module 110, a voltage regulator 112, a brown out detector 114, and an analog to digital converter (ADC) 116.

The power state logic controller is configured to enable the lower power reference voltage circuit to provide a first regulated voltage to the one or more of the modules during a power saving mode, and, on exiting the power saving mode, enable the higher power reference voltage circuit to provide a second regulated voltage to all of the modules. The power state logic controller can toggle the selection circuit to select the higher power reference voltage circuit instead of the lower power reference voltage circuit after exiting the power saving mode. The higher power reference voltage circuit draws little to no power when disabled.

In some implementations, the power state logic controller is configured to disable to the lower power voltage regulator circuit after exiting the power saving mode. In some other implementations, the power state logic controller leaves the lower power voltage regulator circuit enabled because its power consumption is not critical in normal operating mode.

In some implementations, the higher and lower power reference voltage circuits are configured so that the second reference voltage has a higher accuracy with respect to a target reference voltage than the first reference voltage. For example, the higher power reference voltage circuit can comprise bipolar transistors that are less prone to various types of drifts but in turn require larger currents, and the lower power reference voltage circuit can comprise metal-oxide-semiconductor (MOS) transistors which can be used to reduce current consumption.

Some of the modules can be subject to a higher accuracy voltage reference requirement than other modules. For example, some flash memory modules can run faster with a higher accuracy reference voltage. Some of the modules can be disabled during the power saving mode and then enabled on exiting the power saving mode. For example, the flash memory module and the ADC can be disabled during the power saving mode, leaving the voltage regulator and the brown out detector enabled and depending on the lower power reference voltage circuit. Then the flash memory module and the ADC can be enabled on exiting the power saving mode. The system can include different types of modules, e.g., analog comparators, phase locked loop oscillators, and other modules.

The system can optionally include additional reference voltage circuits having varying degrees of power consumption and accuracy. The power state logic controller can select a reference voltage circuit having the lowest power consumption that meets the accuracy requirements of the enabled modules.

Example Flow Diagram

Figure 2:
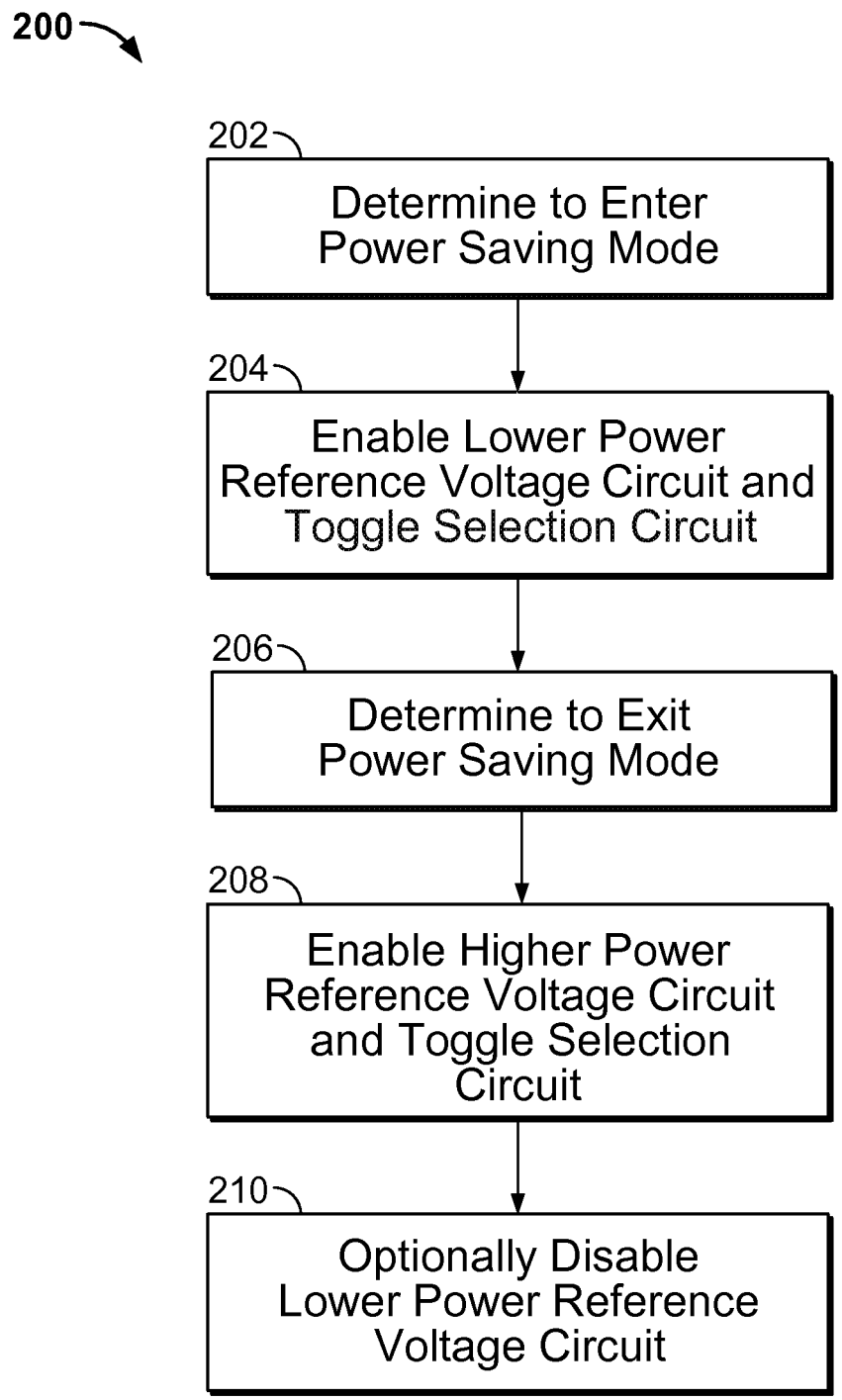
FIG. 2 is a flow diagram of an example process performed by a microcontroller system for entering and exiting a power saving mode.

FIG. 2 is a flow diagram of an example process 200 performed by a microcontroller system for entering and exiting a power saving mode. The system can be the example system 100 of FIG. 1.

The system determines to enter the power saving mode (202). For example, the system can receive a request from a user device to enter the power saving mode, or determine that a threshold period of inactivity has passed.

The system enables a lower power reference voltage circuit and toggles a selection circuit to select the lower power reference voltage circuit (204). The lower power reference voltage circuit provides a lower accuracy reference voltage to one or more modules of the system.

The system determines to exit the power saving mode (206). For example, the system can receive a request from a user device to exit the power saving mode or to perform an operation that the system cannot perform in the power saving mode.

The system enables a higher power reference voltage circuit and toggles the selection circuit to select the higher power reference voltage circuit (208). The higher power reference voltage circuit provides a higher accuracy reference voltage to one or more additional modules of the system, which can be optionally enabled on exiting the power saving mode. The additional modules can be subject to a higher accuracy voltage reference requirement. For example, the additional modules can include a flash memory module, an ADC, or both.

The higher accuracy reference voltage has a higher accuracy with respect to a target reference voltage than the lower accuracy reference voltage. The higher power reference voltage circuit draws more power when enabled than the lower power reference voltage circuit.

Example Microcontroller System

Figure 3:
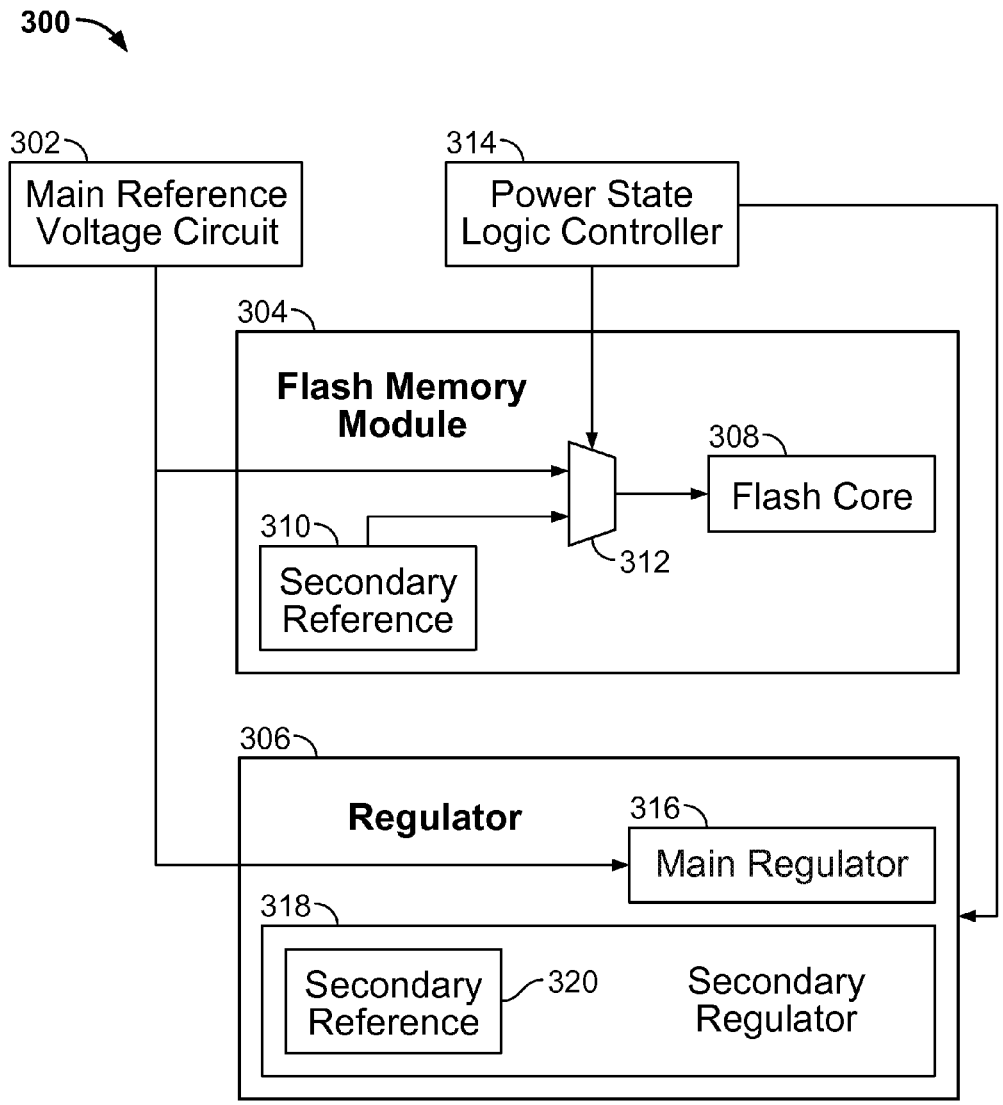
FIG. 3 is a block diagram of an example microcontroller system.

FIG. 3 is a block diagram of an example microcontroller system 300. The system includes a main reference voltage circuit 302 coupled to a flash memory module 304 and a voltage regulator 306.

The flash memory module includes a flash core, a secondary reference voltage circuit 310, and a selection circuit 312. The selection circuit selects between the main reference voltage circuit and the secondary reference voltage circuit internal to the flash memory module. The secondary reference voltage circuit has a faster startup time than the main reference voltage circuit, but the main reference voltage circuit has a higher accuracy with respect to a target reference voltage than the secondary reference voltage circuit. For example, the secondary reference voltage circuit can lack a regulation loop that requires a startup time.

The system includes a power state logic controller 314. The power state logic controller is configured to enable the main reference voltage circuit and the secondary reference voltage circuit on exiting a power saving mode. The power state logic controller configures the selection circuit to select the secondary reference voltage while the main reference voltage is starting up. The power state logic controller configures the selection circuit to select the main reference voltage when the main reference voltage circuit is ready.

In some implementations, the power state logic controller is configured to wait for the secondary reference voltage circuit to be ready after enabling the secondary reference voltage circuit and, after the secondary reference voltage circuit is ready, enable the flash memory module. The flash memory module can then perform memory accesses during a time period between enabling the main reference voltage circuit and configuring the selection circuit to select the main reference voltage circuit.

The voltage regulator includes a main regulator 316 and a secondary regulator 318. The secondary regulator has a lower static current consumption than the main regulator, but also produces a regulated voltage that has a lower accuracy with respect to a target voltage than the main regulator. The lower power regulator includes a secondary reference voltage circuit 320. The secondary reference voltage circuit can have a lower static current consumption than the main reference voltage circuit. The power state logic controller can control the switching between the main regulator and the secondary regulator.

Example Timing Diagram

Figure 4:
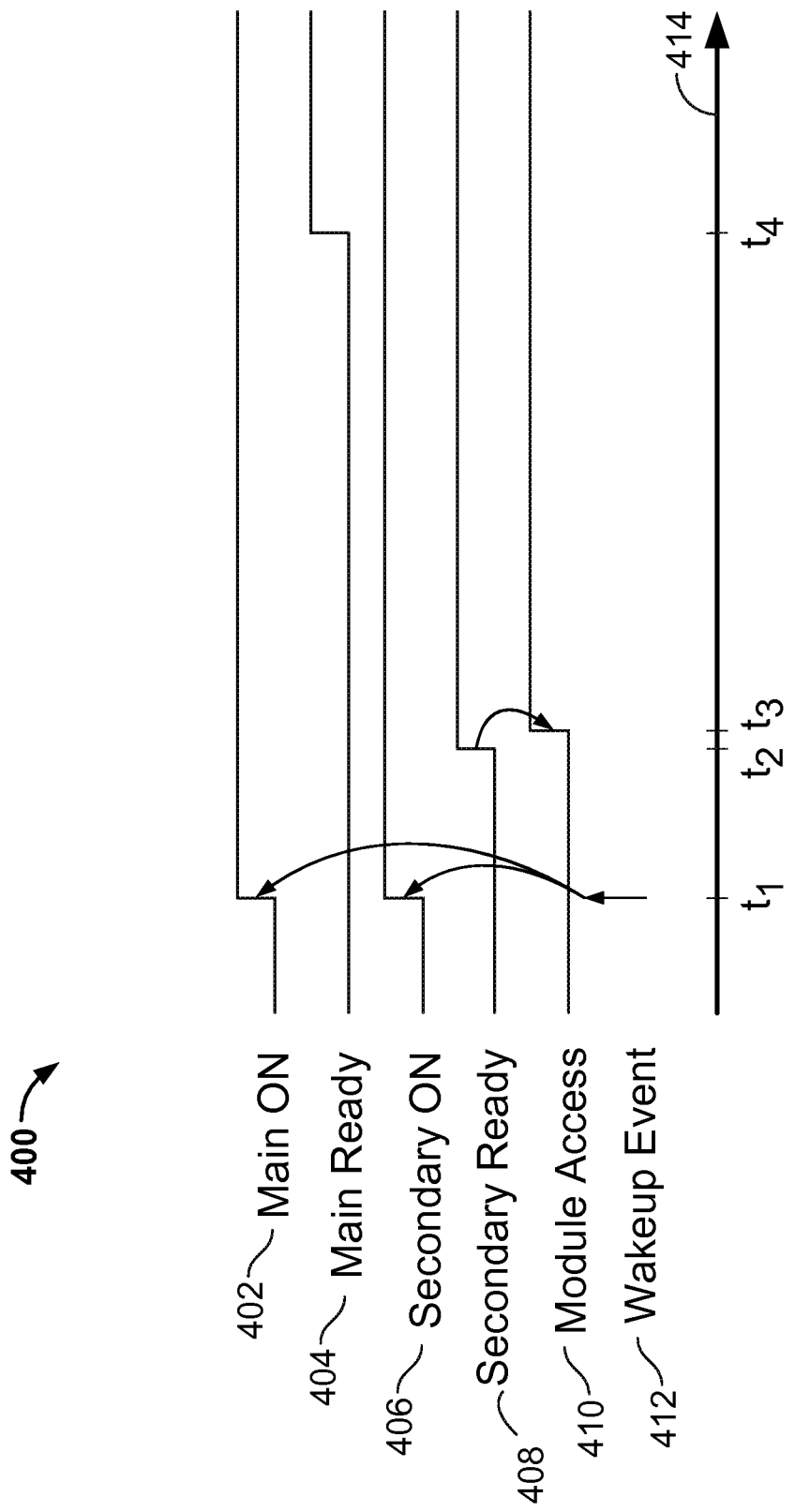
FIG. 4 is an example timing diagram illustrating the operation of the system of FIG. 3.

FIG. 4 is an example timing diagram 400 illustrating the operation of the system 300 of FIG. 3. A timeline 414 illustrates various points in time during the operation of the system.

The "Main ON" signal 402 enables the main reference voltage circuit. The "Main ready" signal 404 indicates that the main reference voltage circuit is ready. The "Secondary ON" signal 406 enables the secondary reference voltage circuit. The "Secondary ready" signal 408 indicates that the secondary reference voltage circuit is ready. The "Module access" signal 410 indicates when the module performs some operation, e.g., a memory access to a flash module. The "Wakeup event" line 412 indicates when the microcontroller system exits the power saving mode.

At time t1, a wakeup event occurs and the system enables both the main reference voltage circuit and the secondary reference voltage circuit. At time t2, the secondary reference voltage circuit is ready. At time t3, the module performs an operation, e.g., a flash memory access. At time t4, the main reference voltage circuit is ready. The system selects the main reference voltage circuit instead of or in addition to the secondary reference voltage circuit, and can optionally disable the secondary reference voltage circuit.

Because the system uses the secondary reference voltage circuit with a faster startup time than the main reference voltage circuit, the module is able to perform operations between t3 and t4. Hence the microcontroller is able to be useful sooner after exiting the power saving mode than it would be if it lacked the secondary reference voltage circuit.

Example Flow Diagram

Figure 5:
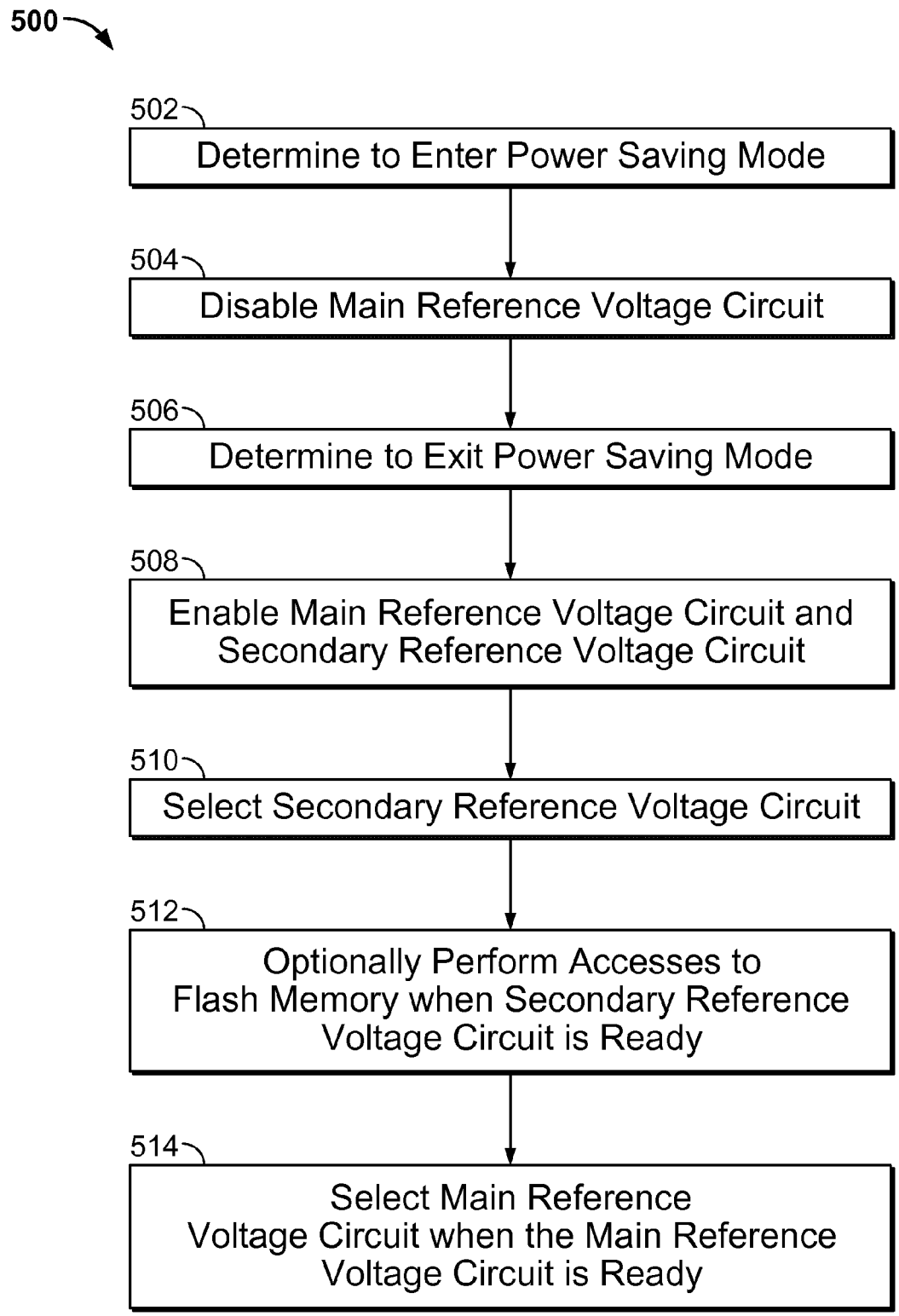
FIG. 5 is a flow diagram of an example process performed by a microcontroller system for entering and exiting a power saving mode.

FIG. 5 is a flow diagram of an example process 500 performed by a microcontroller system for entering and exiting a power saving mode. The system can be the example system 300 of FIG. 3.

The system determines to enter a power saving mode (502). For example, the system can receive a request from a user device to enter the power saving mode.

The system disables a main reference voltage circuit (504). The main reference voltage circuit draws little to no power when disabled.

The system determines to exit the power saving mode (506). For example, the system can receive a request from a user device to exit the power saving mode or to perform an operation that the system cannot perform in the power saving mode.

The system enables the main reference voltage circuit and a secondary reference voltage circuit (508). The secondary reference voltage circuit has a faster startup time than the main reference voltage circuit; hence, the secondary reference voltage circuit will be ready sooner than the main reference voltage circuit even though both circuits are enabled at essentially the same time. The main reference voltage circuit and the secondary reference voltage circuit can be configured so that a main reference voltage has a higher accuracy with respect to a target reference voltage than the secondary reference voltage.

The system selects the secondary reference voltage circuit so that the secondary reference voltage circuit is providing a secondary reference voltage to a module of the microcontroller system while the main reference voltage circuit is starting up (510). The module can be a flash memory module or other type of module.

The system optionally performs operations with the module, e.g., memory accesses to a flash memory module, when the secondary reference voltage circuit is ready (512). The system can wait for the secondary reference voltage circuit to be ready and then, when the secondary reference voltage circuit is ready, enable the module, which may have been disabled on entering the power saving mode to save power. The performance of the module can be degraded. For example, in the case where the module is a flash memory module, the accesses can be done at a lower speed.

The system selects the main reference voltage circuit when the main reference voltage circuit is ready (514) so that the main reference voltage circuit is providing the main reference voltage to the module.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A method comprising:
    entering a power saving mode;
    in response to entering the power saving mode, enabling a lower power reference voltage circuit in a secondary regulator of a regulator circuitry;
    after enabling the lower power reference voltage circuit, waiting for a period of time for the lower power reference voltage circuit to provide a lower power reference voltage with a first level of accuracy with respect to a target reference voltage;
    when the lower power reference voltage circuit provides the lower power reference voltage, providing, by the lower power reference voltage circuit, the lower power reference voltage to one or more first modules of the microcontroller system;
    during a power saving mode of a microcontroller system, disabling a main reference voltage circuit being coupled to a main regulator of the regulator circuitry and comprising a regulation loop, and disabling a secondary reference voltage circuit in a module of the microcontroller system, the main reference voltage circuit being operable to provide a main reference voltage with a second level of accuracy with respect to the target reference voltage, the second level of accuracy being higher than the first level of accuracy;
    on exiting the power saving mode, enabling the main reference voltage circuit and the secondary reference voltage circuit in the module of the microcontroller system, the module being external to the regulator circuitry and the main reference voltage circuit, the secondary reference voltage circuit being different from the lower power reference voltage circuit in the secondary regulator and having a faster startup time than the main reference voltage circuit by virtue of the secondary reference voltage circuit lacking the regulation loop of the main reference voltage circuit, the secondary reference voltage circuit being operable to provide a secondary reference voltage;
    after enabling the secondary reference voltage circuit, waiting for a period of time for the secondary reference voltage circuit to provide the secondary reference voltage;
    selecting the secondary reference voltage circuit so that the secondary reference voltage circuit is providing the secondary reference voltage to the module of the microcontroller system while the main reference voltage circuit is starting up; and
    when the main reference voltage circuit provides the main reference voltage, selecting the main reference voltage circuit so that the main reference voltage circuit is providing the main reference voltage to the module and the secondary reference voltage circuit is stopped to provide the secondary reference voltage to the module, and disabling the lower power reference voltage circuit.

2. The method of claim 1, further comprising:
    when the secondary reference voltage circuit provides the secondary reference voltage, enabling the module that is disabled during the power saving mode.

3. The method of claim 1, wherein the module is a flash memory module, and wherein the secondary reference voltage circuit is within the flash memory module.

4. The method of claim 3, further comprising performing memory accesses to the flash memory module during a time period between enabling the main reference voltage circuit and selecting the main reference voltage circuit.

5. The method of claim 1, wherein the main reference voltage circuit draws no power when disabled during the power saving mode.

6. A microcontroller system comprising:
    a power state logic controller;
    a regulator circuitry comprising a main regulator and a secondary regulator, the secondary regulator including a lower power reference voltage circuit operable to provide a lower power reference voltage with a first level of accuracy with respect to a target reference voltage;

a main reference voltage circuit being coupled to the main regulator and comprising a regulation loop, the main reference voltage circuit being operable to provide a main reference voltage with a second level of accuracy with respect to the target reference voltage, the second level of accuracy being higher than the first level of accuracy;

a module comprising a secondary reference voltage circuit having a faster startup time than the main reference voltage circuit by virtue of the secondary reference voltage circuit lacking the regulation loop of the main reference voltage circuit, the module being external to the regulator circuitry and the main reference voltage circuit, the secondary reference voltage circuit being different from the lower power reference voltage circuit, the secondary reference voltage being operable to provide a secondary reference voltage; and a selection circuit coupled to the power state logic controller, the regulator circuitry, the main reference voltage circuit, the secondary reference voltage circuit, and the module, wherein the power state logic controller is configured to:
enter a power saving mode of the microcontroller system;
enable the lower power reference voltage circuit;
wait for a period of time for the lower power reference voltage circuit to provide the lower power reference voltage;
configure the selection circuit to select the lower power reference voltage circuit to provide the lower reference voltage to one or more first modules of the microcontroller system; and
disable the main reference voltage circuit and the secondary reference voltage circuit in the module during the power saving mode of the microcontroller system, wherein the power state logic controller is configured to:
enable the main reference voltage circuit and the secondary reference voltage circuit on exiting the power saving mode,
wait for a period of time for the secondary reference voltage circuit to provide the secondary reference voltage after enabling the secondary reference voltage circuit,
configure the selection circuit to select the secondary reference voltage circuit while the main reference voltage circuit is starting up, and
configure the selection circuit to select the main reference voltage circuit when the main reference voltage circuit provides the main reference voltage.

7. The system of claim 6, wherein the power state logic controller is configured to, after the secondary reference voltage circuit provides the secondary reference voltage, enable the module.

8. The system of claim 6, wherein the module is a flash memory module, and wherein the secondary reference voltage circuit is within the flash memory module.

9. The system of claim 8, wherein the flash memory module is configured to perform memory accesses during a time period between enabling the main reference voltage circuit and configuring the selection circuit to select the main reference voltage circuit.

* * * * *